United States Patent
Sasaki et al.

(10) Patent No.: US 7,430,875 B2
(45) Date of Patent: Oct. 7, 2008

(54) EXHAUST HEAT RECOVERY SYSTEM

(75) Inventors: Toshitake Sasaki, Toyota (JP); Kiyohito Murata, Susono (JP); Yuji Itoh, Susono (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 467 days.

(21) Appl. No.: 11/075,744

(22) Filed: Mar. 10, 2005

(65) Prior Publication Data

US 2005/0204762 A1    Sep. 22, 2005

(30) Foreign Application Priority Data

Mar. 19, 2004    (JP)    ............... 2004-080784

(51) Int. Cl.
  F25B 27/00    (2006.01)
  F25B 21/02    (2006.01)
  F25D 5/00     (2006.01)
  H01L 35/28    (2006.01)
  F01N 7/14     (2006.01)
  F01N 3/00     (2006.01)
  F01N 5/02     (2006.01)
  F02D 23/00    (2006.01)

(52) U.S. Cl. ........................ 62/238.2; 62/3.2; 62/3.3; 62/3.61; 62/4; 60/272; 60/298; 60/320; 60/601

(58) Field of Classification Search ............ 60/275, 60/298, 320, 601; 62/238, 3.2, 3.3, 3.61, 62/238.2, 238.3, 79, 4; 136/204, 208
See application file for complete search history.

(56) References Cited

U.S. PATENT DOCUMENTS

| | | | | |
|---|---|---|---|---|
| 4,753,682 A | * | 6/1988 | Cantoni | .................. 136/212 |
| 5,323,843 A | * | 6/1994 | Olszewski et al. | ............ 165/10 |
| 7,100,369 B2 | * | 9/2006 | Yamaguchi et al. | ........... 60/324 |
| 7,178,332 B2 | * | 2/2007 | Sasaki | .................. 60/320 |
| 2003/0223919 A1 | * | 12/2003 | Kwak et al. | .................. 422/174 |
| 2004/0191592 A1 | * | 9/2004 | Kamachi et al. | ............. 429/19 |

FOREIGN PATENT DOCUMENTS

| | | |
|---|---|---|
| JP | 2000-297632 | 10/2000 |
| JP | 2001-68138 | 3/2001 |
| JP | 2003-278539 | 10/2003 |
| WO | WO 02/081982 | 10/2002 |
| WO | WO 2004/059138 A1 | 7/2004 |
| WO | WO 2004/059139 A1 | 7/2004 |

* cited by examiner

Primary Examiner—Cheryl J. Tyler
Assistant Examiner—Huseyin Koca
(74) Attorney, Agent, or Firm—Finnegan, Henderson, Farabow, Garrett & Dunner, LLP

(57) ABSTRACT

The exhaust heat recovery system of the invention includes: a thermoelectric conversion element that generates electric energy by thermoelectric conversion using heat of exhaust gas discharged from an engine; and a heat pump including a heat recovery unit that absorbs the heat contained in the exhaust gas through an endothermic reaction using a heating medium, and a heat generation unit which generates heat through an exothermic reaction of the heating medium and which supplies the heat to the thermoelectric conversion element. With this configuration, the thermoelectric conversion element and the heat generation unit are movably attached to each other such that they can be placed in contact with and separated from each other, and the heat recovery unit is positioned in an exhaust gas passage in an exhaust gas downstream flow direction from the heat generation unit.

5 Claims, 12 Drawing Sheets

EXHAUST HEAT RECOVERY SYSTEM

The disclosure of Japanese Patent Application No. 2004-080784 filed on Mar. 19, 2004, including the specification, drawings and abstract is incorporated herein by reference in its entirety.

BACKGROUND OF THE INVENTION

1. Field of the Invention

The invention relates to an exhaust heat recovery system for recovering heat energy in gas, and may be used, for example, in a vehicle like a hybrid vehicle, for converting recovered heat energy from a gas to electric energy.

2. Description of the Related Art

Heat energy is contained within exhaust gas, and the like, that is discharged from an engine of an automobile. Accordingly, if the exhaust gas is simply discharged, the energy is wasted. To address this concern, technologies have been developed that utilize an exhaust heat recovery system to recover the heat energy contained in the exhaust gas, and convert it to electric energy using a thermoelectric conversion element. The converted electric energy can then be used, for example, to recharge a battery.

An example of such a technology for recovering heat energy in an automobile is the fuel recycling system disclosed in Japanese Patent Laid-Open Publication No. 2001-068138. In this fuel recycling system, heat generated by a fuel cell in a fuel cell vehicle is absorbed using a chemical heat pump. Then, the absorbed heat is liberated in an exothermic reaction that is utilized to perform a dehydrogenation-reaction in which hydrogen is separated from a hydrate.

Note that, the above described exhaust heat recovery system can potentially be improved to enable more heat energy in the exhaust gas to be recovered. To achieve this, a configuration can be proposed in which a heat pump is used to recover the heat energy, thus allowing the recovery rate of the heat energy in the exhaust gas to be raised, and the amount of electric power generated by the thermoelectric conversion element to be increased.

However, the fuel recycling system disclosed in Japanese Patent Laid-Open Publication No. 2001-068138 simply uses the chemical heat pump to enable the heat generated from the fuel cell to be used as heat for the dehydrogenation reaction. Accordingly, the disclosed configuration does not conceive of the idea of using a heat pump to transfer heat so that the heat energy contained in the exhaust gas can be converted to electric energy.

SUMMARY OF THE INVENTION

A first aspect of the invention provides an exhaust heat recovery system as described below.

The exhaust heat recovery system of the first aspect includes: a thermoelectric conversion element that generates electric energy by thermoelectric conversion using heat of exhaust gas discharged from an engine; and a heat pump having (1) a heat recovery unit that absorbs heat contained in the exhaust gas through an endothermic reaction using a heating medium, and (2) a heat generation unit which generates heat through an exothermic reaction of the heating medium and which supplies the heat to the thermoelectric conversion element. According to the first aspect, the heat generation unit is disposed in an exhaust passage, and the thermoelectric conversion element and the heat generation unit are movably attached to each other such that they can be placed in contact with and separated from each other. Further, the heat recovery unit is positioned in the exhaust gas passage in an exhaust gas downstream flow direction from the heat generation unit.

Adoption of the above described configuration enables the heat of the exhaust gas that is recovered by the heat recovery unit to be transmitted to the heat generation unit, whereby a large amount of heat can be supplied to the thermoelectric conversion module. Accordingly, the heat pump is favorably utilized to transfer heat so that heat energy contained in the exhaust gas can be converted to electric energy. As a result, it is possible to increase both the recovery rate of the heat energy and the amount of electric energy generated.

Another aspect of the invention provides an exhaust heat recovery system as described below.

The exhaust heat recovery system of this aspect includes: a thermoelectric conversion element that generates electric energy by thermoelectric conversion using heat of exhaust gas discharged from an engine, a heat pump including (1) a heat recovery unit that absorbs heat contained in the exhaust gas through an endothermic reaction using a heating medium, and (2) a heat generation unit which generates heat through an exothermic reaction of the heating medium and which supplies the heat to the thermoelectric conversion element, the heat generation unit being disposed in an exhaust passage, a cooling unit through which a coolant medium can be passed and which can cool the thermoelectric conversion element and an urging portion that can switch at least one of the thermoelectric conversion element and the heat generation unit, and the thermoelectric conversion element and the cooling unit between respective in-contact states and an out-of-contact states. According to this aspect, the heat recovery unit is positioned in the exhaust gas passage in an exhaust gas downstream flow direction from the heat generation unit.

BRIEF DESCRIPTION OF THE DRAWINGS

The above mentioned embodiment and other embodiments, objects, features, advantages, technical and industrial significance of this invention will be better understood by reading the following detailed description of the exemplary embodiments of the invention, when considered in connection with the accompanying drawings, in which.

DETAILED DESCRIPTION OF THE PREFERRED EMBODIMENTS

Figure 1:
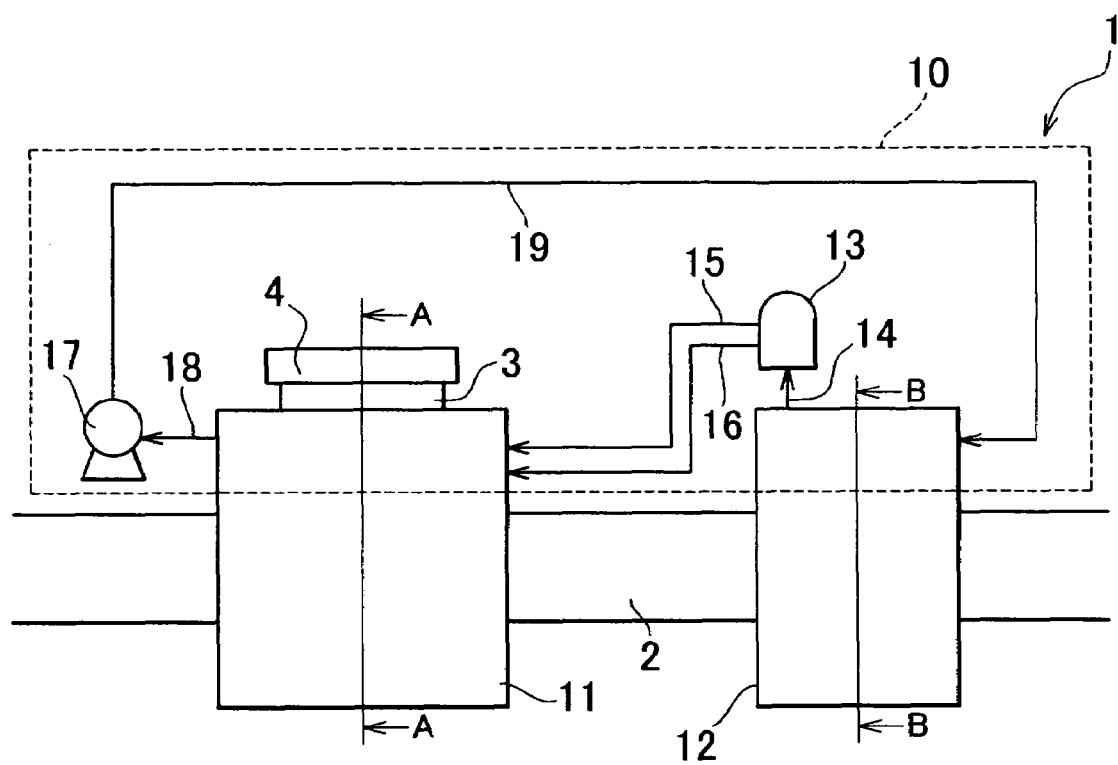
FIG. 1 shows the configuration of an exhaust heat recovery system according to a first embodiment of the invention.

In the following description, the present invention will be described in more detail in terms of exemplary embodiments.

Note that, the same reference numerals are used to denote structural members of the different embodiments that are the same, and repeated description thereof is omitted. The explanation will begin by focusing on the first embodiment of the invention.

Figure 2A:
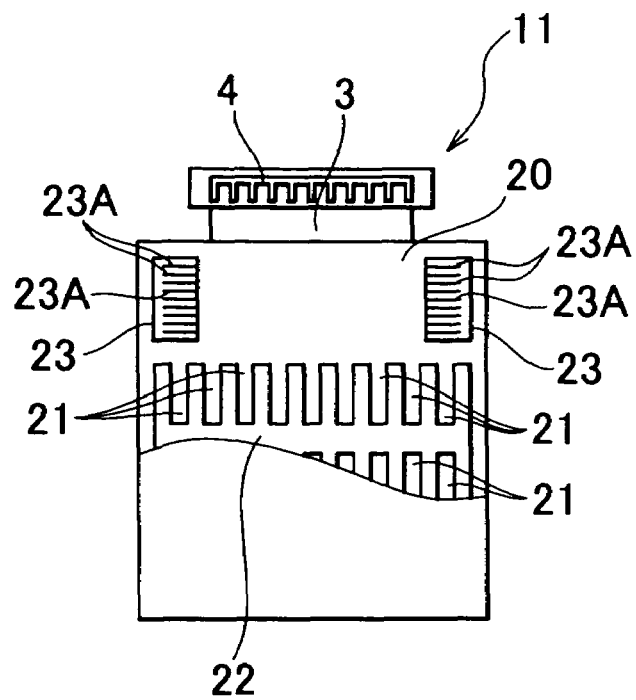
FIG. 2A is a cross-sectional view along a line A-A of FIG. 1.
Figure 2B:
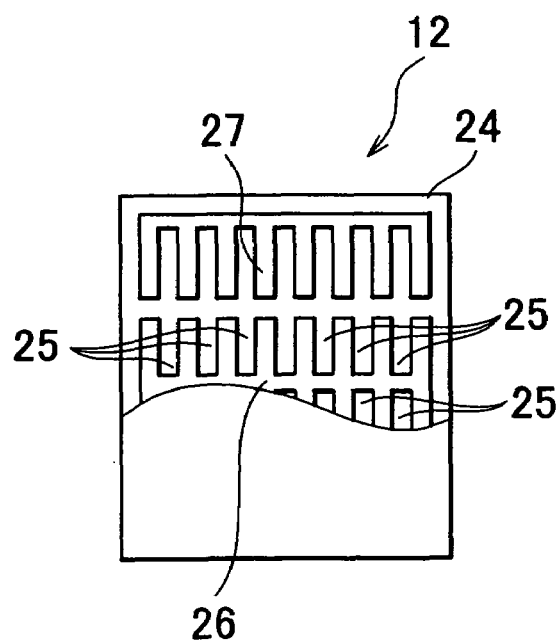
FIG. 2B is a cross-sectional view along a line B-B of FIG. 1.

FIG. 1 shows the configuration of an exhaust heat recovery system 1 according to a first embodiment of the invention; and FIGS. 2A and 2B show respective cross-sectional views along lines A-A and B-B of FIG. 1.

An exhaust heat recovery system 1 according to the first embodiment, as shown in FIG. 1, is provided with an exhaust gas passage 2 that is connected to an engine, not shown, that acts as a heat source. Exhaust gas that is discharged from the engine passes along the exhaust gas passage 2. A chemical heat pump (hereinafter referred to as simply "heat pump") 10 is provided in the exhaust gas passage 2. The heat pump 10 includes a heat generation unit 11 and a heat recovery unit 12. The heat generation unit 11 is positioned toward the upstream side of the flow direction of the exhaust gas, and the heat recovery unit 12 is positioned downstream from the heat generation unit 11.

The heat generation unit 11, as can be seen from FIG. 2A, has a casing 20, in which a plurality of first exhaust heat recovery fins 21 are provided. Further, first exhaust gas passageways 22 through which the exhaust gas passes are formed between the first exhaust heat recovery fins 21. The heat that is contained in the exhaust gas that passes along the first exhaust gas passageways 22 is recovered by the first exhaust heat recovery fins 21. The first exhaust gas passageways 22 communicate with the exhaust gas passage 2.

The casing 20 includes an exothermic reaction portion 23. The exothermic reaction portion 23 is supplied with gaseous hydrogen and acetone as a heating medium, and liquid 2-propanol is generated by the exothermic reaction that takes places therein. In addition, a plurality of fins 23A for recovering the heat generated in the exothermic reaction are provided in the exothermic reaction portion 23.

The heat recovery unit 12, as shown in FIG. 2B, is provided with a casing 24. A plurality of second exhaust heat recovery fins 25 are provided in the casing 24, and second exhaust gas passageways 26 through which exhaust gas passes are formed between the second exhaust heat recovery fins 25. The heat that is contained in the exhaust gas that passes along the second exhaust gas passageways 26 is recovered by the second exhaust heat recovery fins 25. The second exhaust gas passageways 26 communicate with the exhaust gas passage 2.

An endothermic reaction portion 27 is provided in the casing 24. The endothermic reaction portion 27 is supplied with the liquid 2-propanol, and generates gaseous hydrogen and acetone by an endothermic reaction.

A thermoelectric conversion module 3 that acts as a thermoelectric conversion element is attached to the heat generation unit 11. This thermoelectric conversion module 3 is a device that can convert heat energy to electric energy using the so-called Seebeck effect. This embodiment utilizes a BiTe-based thermoelectric conversion module with high thermoelectric conversion efficiency at around 200 degrees Centigrade. It should be noted that the thermoelectric conversion element adopted in this embodiment may be of another type, such as a benzene hydrogen reaction-based thermoelectric conversion element with high thermoelectric conversion efficiency at around 400 degrees Centigrade.

A module cooling unit 4 is attached to the thermoelectric conversion module 3 on a side surface thereof that is opposite to the side on which the heat generation unit 11 is attached. The module cooling unit 4 is supplied with coolant that acts a coolant medium, thus enabling the thermoelectric conversion module 3 to perform thermoelectric conversion in which electric energy is generated from the recovered heat of the heat generation unit 11. At this time, an exothermic reaction takes place in the exothermic reaction portion 23 of the heat generation unit 11 due to the recovery of heat in the thermoelectric conversion module 3. Note that, the heat generation unit 11 recovers both (1) the heat generated when the hydrogen and acetone react to form 2-propanol, and (2) the heat within the exhaust gas, and then this heat is recovered from the heat generation unit 11 by the thermoelectric conversion module 3.

A separator 13 is provided between the endothermic reaction portion 27 of the heat recovery unit 12 and the exothermic reaction portion 23 of the heat generation unit 11. This separator 13 is connected to the heat generation unit 11 and the heat recovery unit 12 via three gas passages, namely a first gas passage 14, a second gas passage 15 and a third gas passage 16. The separator 13 separates the gaseous mixture of hydrogen and acetone that is discharged from the endothermic reaction portion 27 of the heat recovery unit 12 into hydrogen and acetone. Note that, the gaseous mixture of hydrogen and acetone passes along the first gas passage 14 that connects the endothermic reaction portion 23 of the heat generation unit 11 and the separator 13. Moreover, amongst the gas passages connecting the separator 13 and the exothermic reaction portion 23 of the heat generation unit 11, hydrogen passes along the second gas passage 15 and the acetone passes along the third gas passage 16.

Further, a liquid transferring pump 17 is provided between the exothermic reaction portion 23 of the heat generation unit 11 and the endothermic reaction portion 27 of the heat recovery unit 12. This liquid transferring pump 17 is connected respectively to the heat generation unit 11 and the heat recovery unit 12 via first and second liquid passages 18 and 19. The liquid transferring pump 17 transfers the liquid 2-propanol that is liquefied in the exothermic reaction portion 23 of the heat generation unit 11 toward the endothermic reaction portion 27 of the heat recovery unit 12.

Next, the operation and effects of the above-described exhaust heat recovery system 1 according to the first embodiment will be explained.

In the exhaust heat recovery system 1 according to the first embodiment, the exhaust gas that is discharged from the engine, not shown, flows through the exhaust gas passage 2. Note that, the exhaust gas that flows through the exhaust gas passage 2 passes through the first exhaust gas passageways 22 formed in the heat generation unit 11 and the second exhaust gas passageways 26 formed in the heat recovery unit 12.

The exhaust gas that passes along the exhaust gas passage 2 first flows through the first exhaust gas passageways 22 formed in the heat generation unit 11. At this time, some of the heat contained within the exhaust gas is recovered by the first exhaust heat recovery fins 21, whereby the amount of heat contained in the exhaust gas is reduced. The heat recovered by the first exhaust heat recovery fins 21 is then supplied to the thermoelectric conversion module 3 via the casing 20.

Since the thermoelectric conversion module 3 receives the heat from the casing 20, the temperature of the side surface of the thermoelectric conversion module 3 that is attached to the casing 20 rises. On the other hand, however, the temperature of the opposite side surface of the thermoelectric conversion module 3 that is attached to the module cooling unit 4, as opposed to the side surface attached to the casing 20, is maintained at a low set temperature. As a result of the different temperatures of the opposing side surfaces of the thermoelectric conversion module 3, temperature difference is generated within the thermoelectric conversion module 3 which enables thermoelectric conversion to be performed.

The discharged exhaust gas flows though the first exhaust gas passageways 22 and then passes into the second exhaust gas passageways 26 of the heat recovery unit 12. At this point, the heat contained in the exhaust gas is further recovered by the second exhaust heat recovery fins 25. As a result, even more heat is removed from the exhaust gas, which is then discharged from second exhaust gas passageways 26.

Note that, the liquid transferring pump 17 supplies the 2-propanol from the exothermic reaction portion 23 of the heat generation unit 11 to the endothermic reaction portion 27 of the heat recovery unit 12. In the heat recovery unit 12, the heat recovered by the second exhaust heat recovery fins 25 imparts heat to the 2-propanol that is the liquid in the endothermic reaction portion 27, whereby the 2-propanol is separated into hydrogen and acetone. The separated hydrogen and acetone then pass along the first gas passage 14 in a mixed state and are carried to the separator 13.

Following this, the mixed hydrogen and acetone are separated in the separator 13, and the hydrogen passes along the second gas passage 15, and the acetone along the third gas passage 16 so as to be supplied to the exothermic reaction portion 23 of the heat generation unit 11.

2-propanol is then generated in the exothermic reaction portion 23 from the supplied hydrogen and acetone. Note that, the reaction in which the 2-propanol is generated is an exothermic reaction. Accordingly, heat is liberated when the 2-propanol is generated. This liberated heat is recovered by the fins 23A. The heat recovered in this way is then supplied to the thermoelectric conversion module 3 via the casing 20.

By adopting the above configuration, the heat pump 10 is utilized to supply heat from the downstream side of the exhaust gas passage 2 to the thermoelectric conversion module 3 positioned at the upstream side. With this configuration, the amount of heat supplied to the thermoelectric conversion module 3 is greater than when just heat recovered by the first exhaust heat recovery fins 21 is supplied thereto. Thus, it is possible to generate a larger temperature difference between the two opposing side surfaces of the thermoelectric conversion module 3.

It should be noted that the thermoelectric conversion efficiency η of the thermoelectric conversion module 3 is given by Equation 1 below:

$$\eta = \frac{Th - Tc}{Th} \cdot \frac{\sqrt{1+ZT} - 1}{\sqrt{1+ZT} + \frac{Tc}{Th}} \quad (1)$$

where, Th is the temperature of the high temperature side of the thermoelectric conversion module; Tc is the temperature of the low temperature side of the thermoelectric conversion module; and ZT is a figure of merit.

As is apparent from Equation (1), if the temperature of the low temperature side of the thermoelectric conversion module 3 is a constant, the thermoelectric conversion efficiency η of the thermoelectric conversion module 3 becomes higher as the temperature of the high temperature side of the thermoelectric conversion module 3 rises. Accordingly, increasing the temperature of the high temperature side makes it possible to raise the thermoelectric conversion efficiency η of the thermoelectric conversion module 3, which allows the amount of electricity generated to be increased by an equivalent extent.

Note that, it is necessary for there to be at least some degree of temperature difference in the thermoelectric conversion module 3 for thermoelectric conversion to be performed. Thus, for example, when the amount of heat contained in the exhaust gas is small (such as when the engine has just been started, or when there is only a small amount of exhaust gas flowing), it is not possible to obtain the amount of heat necessary for the thermoelectric conversion module 3 to perform electricity generation by just recovering the heat from the exhaust gas. As a result, electricity generation cannot be performed.

However, the exhaust heat recovery system 1 according to the first embodiment is not affected by the above described problem because the heat pump 10 is used to enable the heat recovered by the heat recovery unit 12 positioned downstream from the thermoelectric conversion module 3 to be supplied to the thermoelectric conversion module 3 via the heat generation unit 11. Accordingly, even if the amount of heat contained in the exhaust gas is small, it is possible for the thermoelectric conversion module 3 to generate electric energy.

Note that, when engine load is substantial and the amount of heat contained in the exhaust gas is large, there are occasions when it is not possible to release all the heat recovered by the heat recovery portion 12 using the heat generation unit 11. In this case, the heat that cannot be released can be stored in the heat pump 10, and then recovered again when engine load has reduced. As a result of this configuration it is possible to improve the efficiency of the system.

Figure 3:
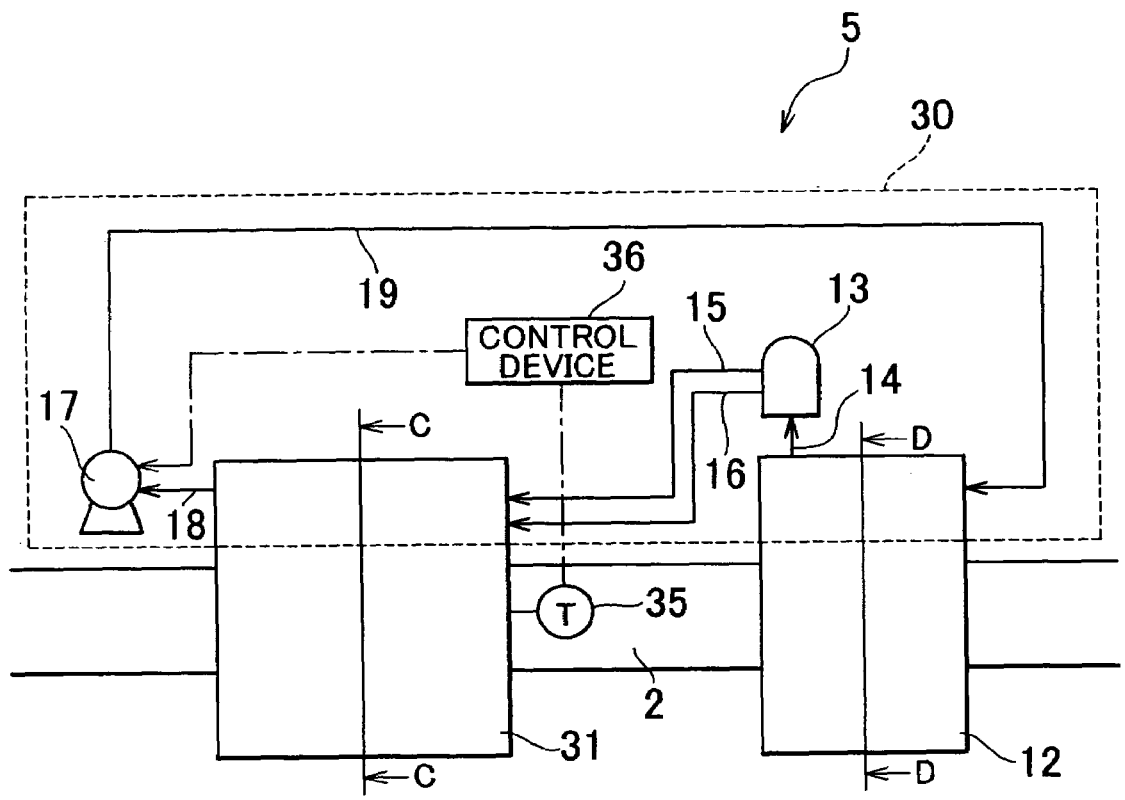
FIG. 3 shows the configuration of an exhaust heat recovery system according to a second embodiment of the invention.

Next, a second embodiment of the invention will be described. FIG. 3 shows the configuration of an exhaust heat recovery system according to the second embodiment of the invention, and FIGS. 4A and 4B show respective cross-sectional views along lines C-C and D-D of FIG. 3.

As can be seen from FIG. 3, an exhaust heat recovery system 5 according to the second embodiment is provided with a heat pump 30. The heat pump 30 has a catalyst storage unit 31, and the heat recovery unit 12 of the first embodiment. Both the catalyst storage unit 31 and the heat recovery unit 12 are provided in the exhaust gas passage 2. Note that, the catalyst storage unit 31 is positioned in the upstream flow direction of the exhaust gas passage 2 from the heat recovery unit 12, or, in other words, the heat recovery unit 12 is positioned downstream of the catalyst storage unit 31.

Figure 4A:
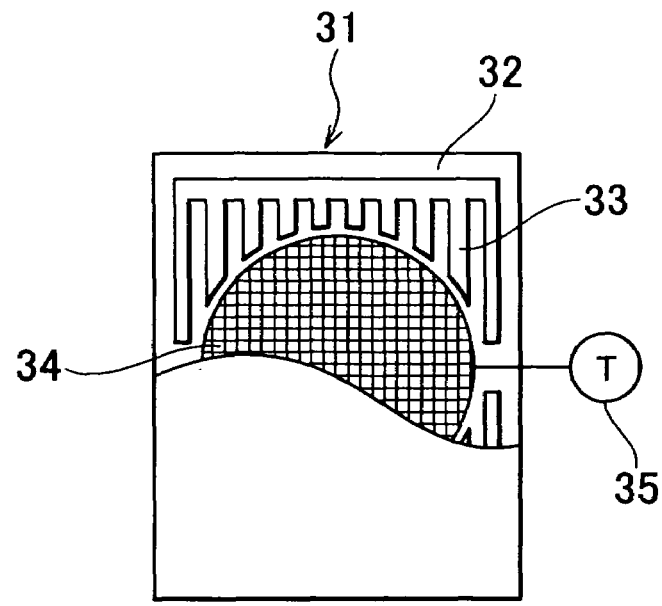
FIG. 4A is a cross-sectional view along a line C-C of FIG. 3.
Figure 4B:
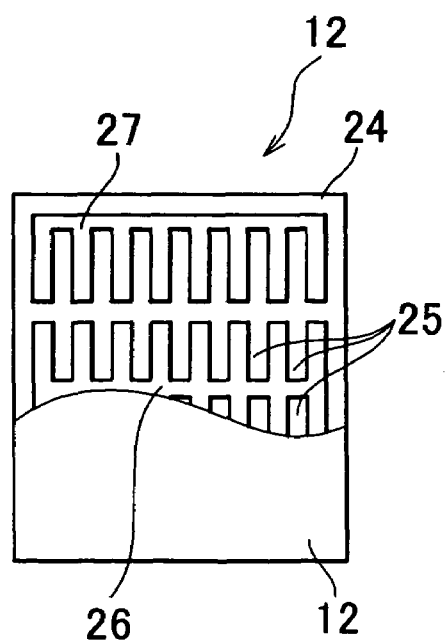
FIG. 4B is a cross-sectional view along a line D-D of FIG. 3.

The catalyst storage unit 31 is provided with a casing 32 as shown in FIG. 4A. The casing 32 contains an exothermic reaction portion 33 that is able to generate 2-propanol from gaseous hydrogen and acetone that is provided thereto. Further, the casing 32 also contains a catalyst 34. This catalyst 34 is an exhaust gas purification catalyst, which demonstrates adequate purification performance when operated at or within a range above its activation temperature, which is, for example, a temperature that is equal to or above a set temperature with a range, for example, of 300° to 400° Centigrade. The catalyst 34 is provided in the exhaust gas passage 2 such that exhaust gas passes through the catalyst 34.

A temperature sensor 35 for detecting the temperature of the catalyst 34 is connected to the catalyst storage unit 31.

This temperature sensor 35 is directly attached to the catalyst 34 and detects the temperature thereof. The temperature sensor 35 outputs a temperature detection result specifying the detected temperature of the catalyst 34 to a control device 36, which corresponds to a warm-up requirement determination portion according to the invention. The control device 36 determines whether or not the catalyst 34 needs to be warmed up, based on the detected temperature of the catalyst 34, and controls the liquid transferring pump 17 to be operational or non-operational depending on whether the catalyst 34 needs to be warmed up. Note that, as shown in FIG. 4B, the heat recovery unit 12 has the same configuration as that of the first embodiment.

Next, the operation and effects of the above-described exhaust heat recovery system 5 according to the second embodiment will be explained.

In the exhaust heat recovery system 5 according to the second embodiment, the exhaust gas that is discharged from the engine, not shown, flows through the exhaust gas passage 2. Note that, the exhaust gas that flows through the exhaust gas passage 2 passes through the catalyst 34 formed in the catalyst storage unit 31, and then through the second exhaust gas passageways 26 formed in the heat recovery unit 12.

The exhaust gas that flows along the exhaust gas passage 2 is purified as it passes through the catalyst 34, and then discharged from the vehicle via a muffler, not shown. However, if the temperature of the catalyst 34 is low, the catalyst 34 is not adequately warmed-up, and thus its purification performance is impaired. To address this problem, the temperature sensor 35 is provided for the catalyst 34. Accordingly, the temperature of the catalyst 34 can be detected and this temperature detection result output to the control device 36.

The control device 36 stores information related to the temperature at which the catalyst 34 is sufficiently warmed up, and compares this information and the temperature detection result output from the temperature sensor 35. When it is determined that the temperature of the catalyst 34 has not reached a sufficiently warm temperature, the control device 36 activates the liquid transferring pump 17, whereby 2-propanol is caused to flow along the first and second liquid passages 18 and 19. At the same time as the 2-propanol is flowing along the first and second liquid passages 18 and 19, the gaseous mixture of hydrogen and acetone passes along the first gas passage 14, and is then separated such that the hydrogen passes along the second gas passage 15 and the acetone passes along the third gas passage 16.

It should be noted that the catalyst 34 provided in the catalyst storage unit 31 is warmed by absorbing heat from the exhaust gas. However, any heat that cannot be absorbed is transferred to the heat recovery unit 12. The heat recovery unit 12 utilizes the second exhaust heat recovery fins 25 to absorb any heat remaining in the exhaust gas that passes through the second exhaust gas passageways 26.

When the liquid transferring pump 17 is activated when the temperature of the catalyst 34 has not reached a sufficiently warm temperature, an endothermic reaction takes place in the endothermic reaction portion 27 of the heat recovery unit 12 in which the 2-propanol is separated into hydrogen and acetone. Further, in the exothermic reaction portion 33 of the catalyst storage unit 31, hydrogen and acetone are combined in an exothermic reaction in which 2-propanol is generated. Then, the generated 2-proponal is transferred to the endothermic reaction portion 27 of the heat recovery unit 12 via the first and second liquid passages 18 and 19.

With this configuration, it is possible to supply the heat recovered by the heat recovery unit 12 to the catalyst storage unit 31, and use this heat to quickly warm-up the catalyst 34 provided in the catalyst storage unit 31.

Figure 5:
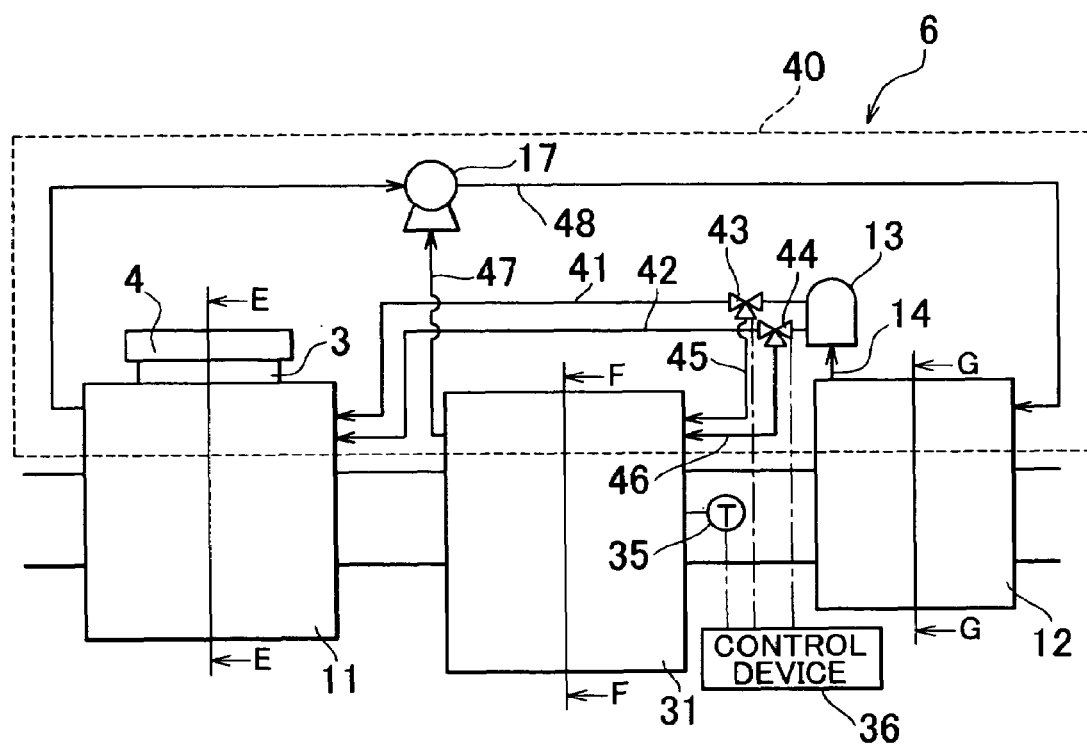
FIG. 5 shows the configuration of an exhaust heat recovery system according to a third embodiment of the invention.

Next, a third embodiment of the invention will be described with reference to the drawings. FIG. 5 shows the configuration of an exhaust heat recovery system 6 according to the third embodiment of the invention, and FIGS. 6A, 6B and 6C show respective cross-sectional views along lines E-E, F-F and G-G of FIG. 5.

As shown in FIG. 5, the exhaust heat recovery system 6 according to the third embodiment is provided with a heat pump 40. The heat pump 40 is provided with the heat generation unit 11 and the heat recovery unit 12, both of which are the same as those of the first embodiment. In addition, the heat pump 40 is provided with the catalyst storage unit 31 of the second embodiment. These structural members are positioned such that: the heat generation unit 11 is furthest to the upstream side of the exhaust gas passage 2; the catalyst storage unit 31 is downstream from the heat generation unit 11; and the heat recovery unit 12 is downstream from the catalyst storage unit 31. Note that, the temperature sensor 35 for detecting the temperature of the catalyst 34 is attached to the catalyst storage unit 31. This temperature sensor 35 outputs the temperature detection result for the catalyst 34 to the control device 36.

Figure 6A:
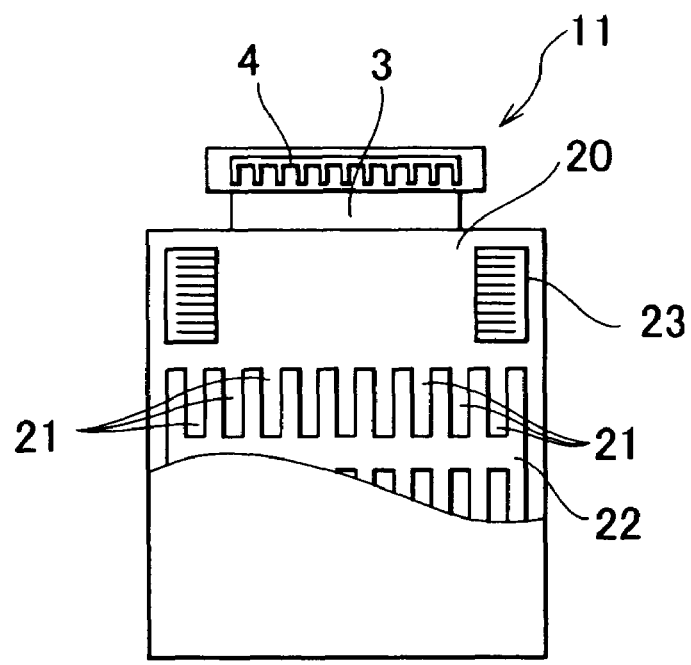
FIG. 6A is a cross-sectional view along a line E-E of FIG. 5.
Figure 6B:
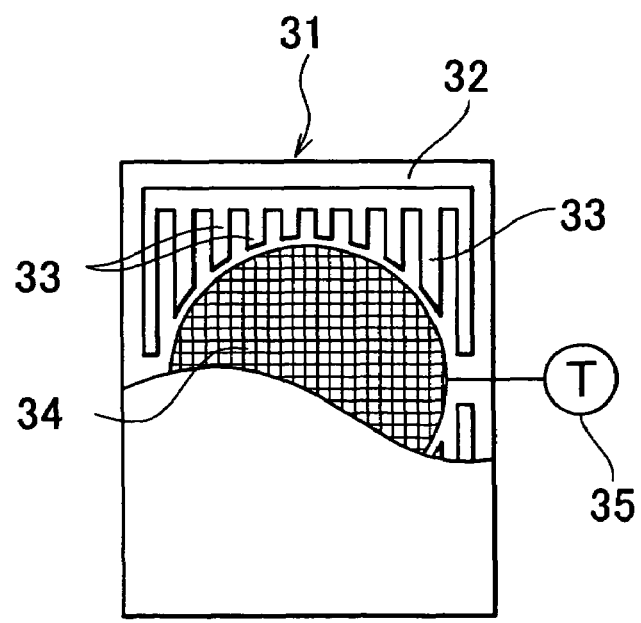
FIG. 6B is a cross-sectional view along a line F-F of FIG. 5.
Figure 6C:
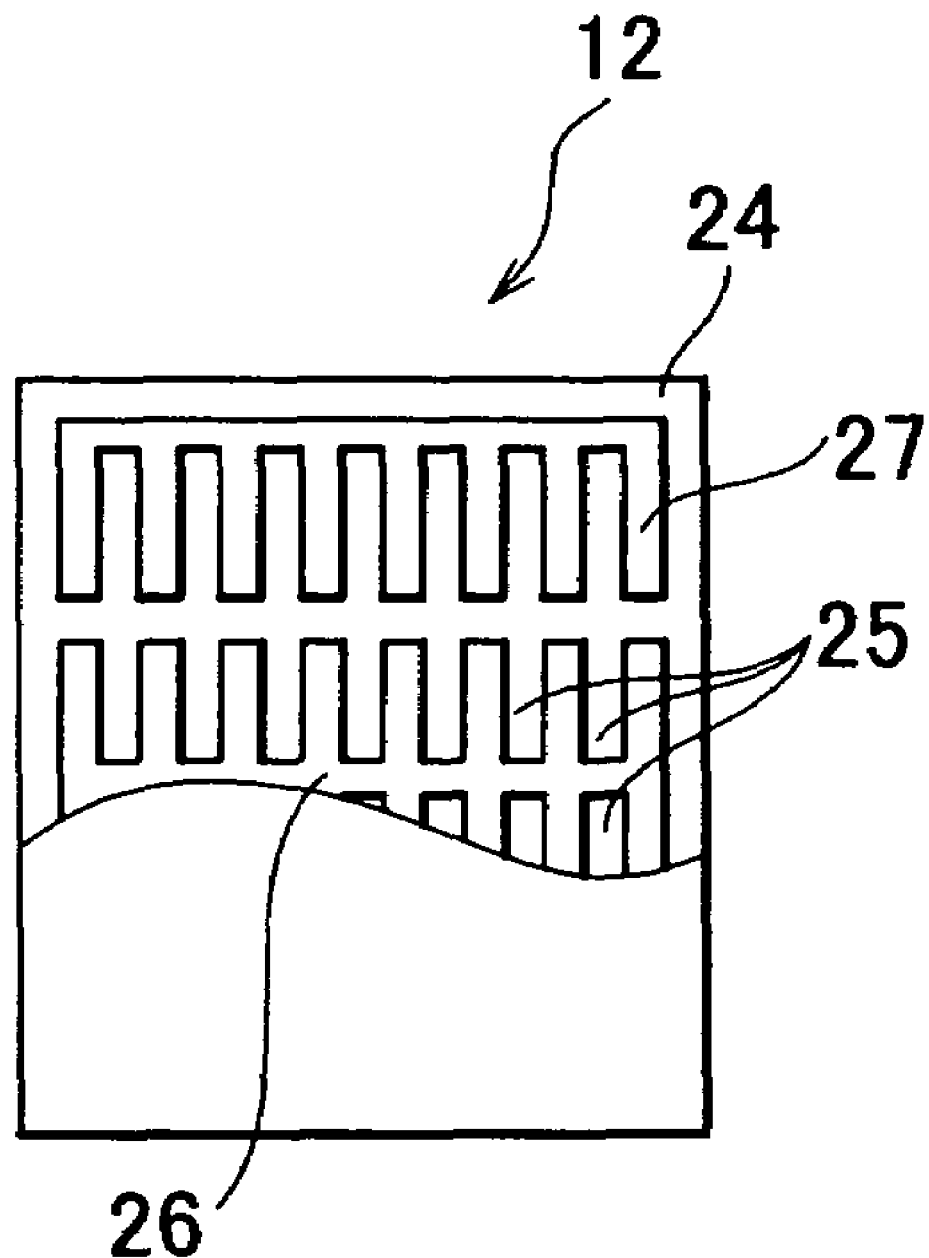
FIG. 6C is a cross-sectional view along a line G-G of FIG. 5.

In the exhaust heat recovery system 6 according to the third embodiment, the separator 13 is connected to the exothermic reaction portion 23 of the heat generation unit 11 shown in FIG. 6A via second and third gas passages 41 and 42. More specifically, hydrogen flows along the second gas passage 41, and acetone flows along the third gas passage 42. Further, respective first and second switching valves 43 and 44 are provided at positions along the second and third gas passages 41 and 42. The first and second switching valves 43 and 44 correspond to a selection portion of the invention. By switching the first and second switching valves 43 and 44, namely, the selection means or the selection portion, it is possible to select the supply destination of the heat, namely, which one of the thermoelectric conversion module 3 and the catalyst 34 is supplied with heat.

The first and second switching valves 43 and 44, as well as being provided in the second and third gas passages 41 and 42, are connected to respective fourth and fifth gas passages 45 and 46. The fourth and fifth gas passages 45 and 46 are respectively connected to the exothermic reaction portion 33 of the catalyst storage unit 31, shown in FIG. 6B. More particularly, hydrogen flows along the fourth gas passage 45 and acetone flows along the fifth gas passage 46. The exothermic reaction portion 33 is connected to the liquid transferring pump 17 via a third liquid passage 47. Note that, the remaining structural members and configuration of the third embodiment is the same as that of the first embodiment.

Hereinafter, the operation and effects of the above-described exhaust heat recovery system 6 according to the third embodiment will be explained.

In the exhaust heat recovery system 6 according to the third embodiment, the exhaust gas that is discharged from the engine, not shown, flows through the exhaust gas passage 2. Note that, the exhaust gas that flows through the exhaust gas passage 2 passes through the first exhaust gas passageways 22 formed in the heat generation unit 11, then through the catalyst 34 formed in the catalyst storage unit 31, and then through the second exhaust gas passageways 26 formed in the heat recovery unit 12.

When the exhaust gas passes along the first exhaust gas passageways 22, some of the heat contained within the exhaust gas is recovered by the first exhaust heat recovery fins 21, and is discharged from the heat generation unit 11. More specifically, the heat recovered by the first exhaust heat recovery fins 21 is supplied to the thermoelectric conversion module 3 via the casing 20. The exhaust gas discharged from the heat generation unit 11 then flows into the catalyst storage unit 31, and passes through the catalyst 34. At this time, the exhaust gas is purified by the purification action of the catalyst 34, and then discharged from the catalyst storage unit 31.

Next, the exhaust gas discharged from the catalyst storage unit 31 flows into the heat recovery unit 12, and passes the second exhaust gas passageways 26. At this time, the heat contained in the exhaust gas is further recovered by the second exhaust heat recovery fins 25. In this way, the exhaust gas has more heat removed from it by the second exhaust heat recovery fins 25, and is then discharged from the second exhaust gas passageways 26.

The heat recovered by the second exhaust heat recovery fins 25 in the heat recovery unit 12 is used in the endothermic reaction portion 27 for the endothermic reaction in which the 2-propanol is separated into hydrogen and acetone. The hydrogen and acetone generated by the separation accompanying this endothermic reaction is supplied as a gaseous mixture to the separator 13 via the first gas passage 14, and is then separated by the separator 13 into hydrogen and acetone.

Note that, the temperature sensor 35 is provided for the catalyst storage unit 31, and outputs the temperature detection result for the temperature of the catalyst 34 to the control device 36. The control device 36 stores information related to the temperature at which the catalyst 34 is sufficiently warmed up, and compares this information and the temperature detection result output from the temperature sensor 35. When it is determined that the temperature of the catalyst 34 has not reached a sufficiently warm temperature, the control device 36 switches the first and second switching valves 43 and 44 to the respective sides of the fourth and fifth gas passages 45 and 46.

When the first and second switching valves 43 and 44 are switched to the respective sides of the fourth and fifth gas passage 45 and 46, the hydrogen and acetone generated by the endothermic reaction portion 27 of the heat recovery unit 12 is supplied to the exothermic reaction portion 33 of the catalyst storage unit 31. Then, in the exothermic reaction portion 33, the hydrogen and acetone are combined in an exothermic reaction in which the 2-propanol is generated. Following this, the generated 2-propanol is transferred to the endothermic reaction portion 27 of the heat recovery unit 12 via the third liquid passage 47 and a fourth liquid passage 49.

By adopting the above described configuration it is possible to supply the heat recovered by the heat recovery unit 12 to the catalyst storage unit 31, and use this heat to quickly warm-up the catalyst 34 provided in the catalyst storage unit 31.

On the other hand, when the temperature of the catalyst 34 detected by the temperature sensor 35 has reached a sufficiently warm temperature, it is not necessary to warm-up the catalyst 34. Accordingly, at this time, the control device 36 switches the first and second switching valves 43 and 44 to the respective sides of the second and third gas passages 41 and 42. Accordingly, the hydrogen and acetone generated in the endothermic reaction portion 27 of the heat recovery portion 12 are supplied to the exothermic reaction portion 23 of the heat generation unit 11.

Then, 2-propanol is generated in the exothermic reaction portion 23 from the supplied hydrogen and acetone. The reaction that generates this 2-proponal is an exothermic reaction. Accordingly, heat is liberated when the 2-propanol is generated. This liberated heat is recovered by the fins 23A.

The heat recovered in this way is then supplied to the thermoelectric conversion module 3 via the casing 20.

With this configuration, the amount of heat supplied to the thermoelectric conversion module 3 is greater than when just heat recovered by the first exhaust heat recovery fins 21 is supplied thereto. Thus, by adopting this configuration, it is possible to generate a larger temperature difference between the two opposing side surfaces of the thermoelectric conversion module 3. Accordingly, it is possible to generate a larger amount of electric energy using the thermoelectric conversion module 3.

As a result of using this configuration, the exhaust heat recovery system 6 of the third embodiment is able to select the supply destination of the heat (namely, where the heat recovered by the heat recovery unit 12 is supplied to) depending on the temperature of the catalyst 34. More specifically, when the temperature of the catalyst 34 has not reached the activation temperature thereof, namely, when the catalyst 34 needs to be warmed-up, the heat from the heat recovery unit 12 is supplied to the catalyst storage unit 31. On the other hand, when the temperature of the catalyst 34 has reached the activation temperature, namely, when the catalyst 34 does not need to be warmed up, the heat from the heat recovery unit 12 is supplied to the heat generation unit 11. In this way, when the catalyst 34 needs to be warmed up, the warm-up of the catalyst 34 can be achieved more quickly; and when the catalyst 34 does not need to be warmed up, it is possible to increase the amount of electric energy generated by the thermoelectric conversion module 3.

Figure 7:
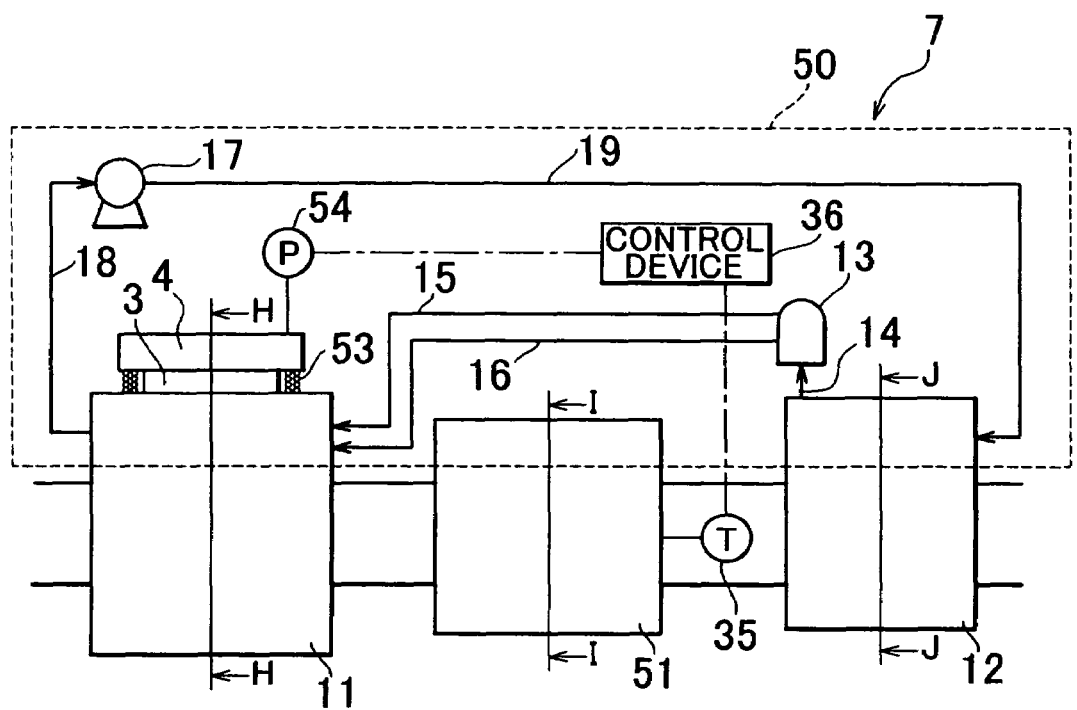
FIG. 7 shows the configuration of an exhaust heat recovery system according to a fourth embodiment of the invention.
Figure 8A:
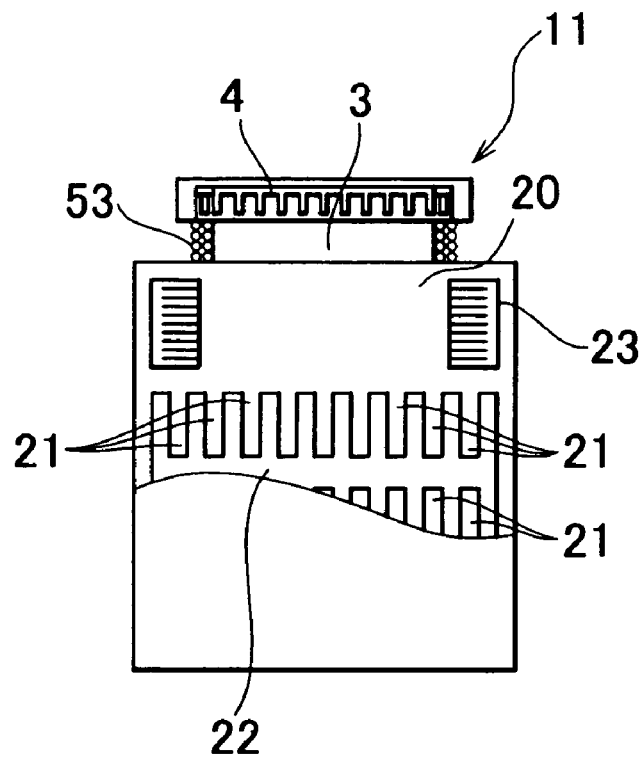
FIG. 8A is a cross-sectional view along a line H-H of FIG. 7.
Figure 8B:
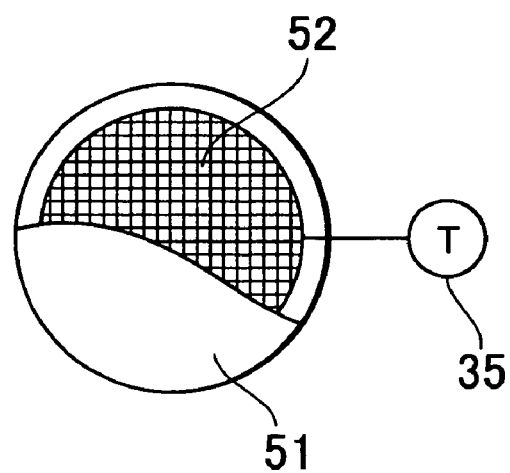
FIG. 8B is a cross-sectional view along a line I-I of FIG. 7.
Figure 8C:
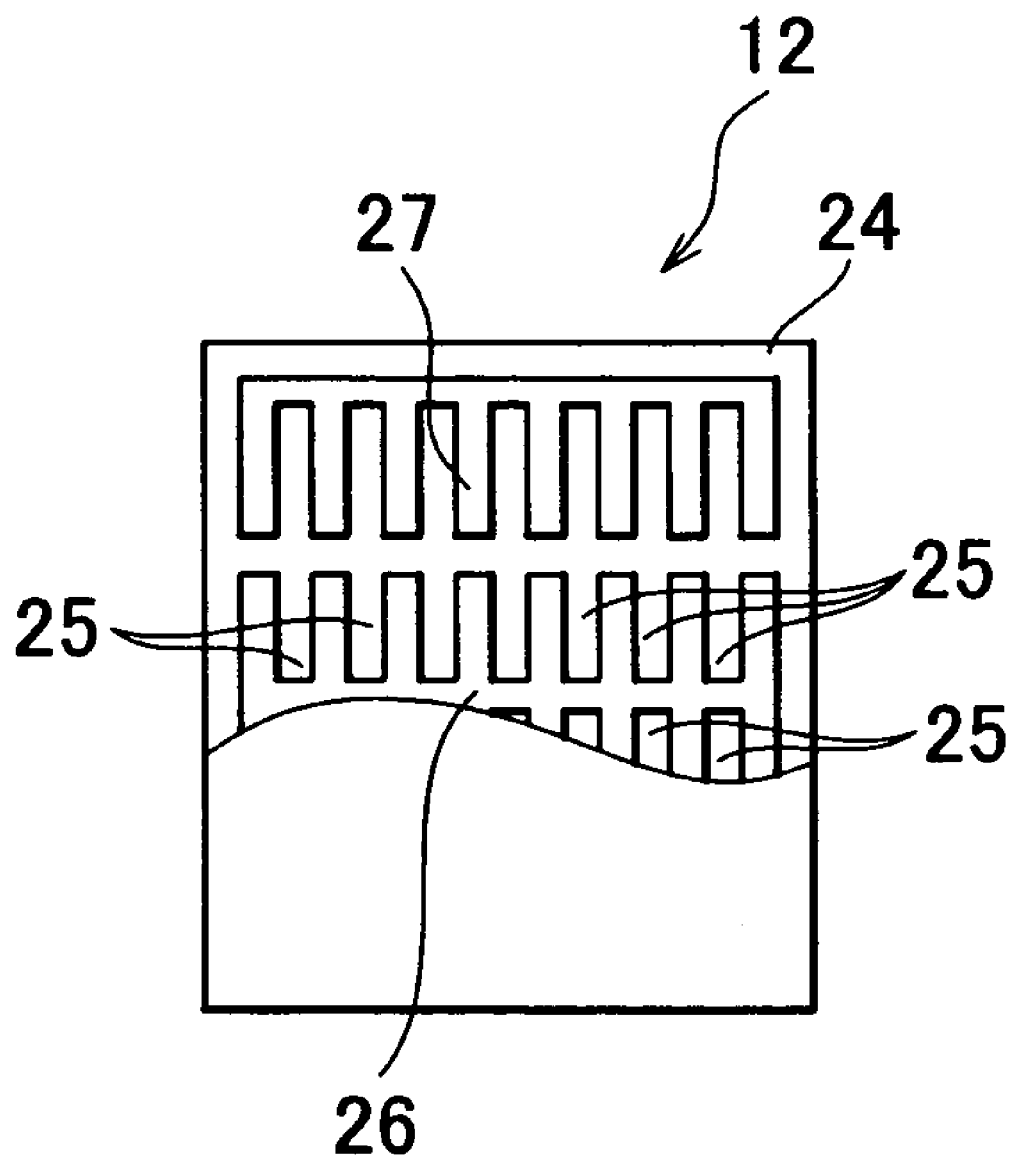
FIG. 8C is a cross-sectional view along a line J-J of FIG. 7.

Next, a fourth embodiment of the invention will be described with reference to the drawings. FIG. 7 shows the configuration of an exhaust heat recovery system 7 according to the fourth embodiment of the invention, and FIGS. 8A, 8B and 8C show respective cross-sectional views along lines H-H, I-I and J-J of FIG. 7.

As shown in FIG. 7, the exhaust heat recovery system 7 of the fourth embodiment is provided with a heat pump 50. The heat pump 50 is provided with the heat generation unit 11 and the heat recovery unit 12, which are the same as those of third embodiment. In addition, a catalyst storage unit 51 is provided in the exhaust gas passage 2. The catalyst storage unit 51, as shown in FIG. 8B, contains a catalyst 52. This catalyst 52, like the catalyst 34 of the third embodiment, is an exhaust gas purification catalyst that demonstrates adequate purification performance when operated at or within a range above its activation temperature.

Note that, in the exhaust heat recovery system 7 according to the fourth embodiment, a spring 53 that acts as urging means is interposed between the thermoelectric conversion module 3 and the module cooling unit 4. By compressing this spring 53, it is possible to switch between two states, namely, a state in which the thermoelectric conversion module 3 and the module cooling unit 4 are in contact, and a state in which they are apart.

In addition, a liquid transferring pump 54 for supplying coolant to the module cooling unit 4 is also provided. This liquid transferring pump 54 is connected to the control device 36, which controls the liquid transferring pump 54. If the liquid transferring pump 54 is activated, coolant is caused to circulate and is supplied to the module cooling unit 4. When this coolant is supplied to the module cooling unit 4, the module cooling unit 4 is pushed toward the thermoelectric conversion module 3 in resistance to urging force of the spring 53, and the module cooling unit 4 and the thermoelectric conversion module 3 are placed in contact with each other. On the other hand, when the liquid transferring pump 54 is stopped, the supply of coolant to the module cooling unit 4 is interrupted, and the urging force of the spring 53 causes the module cooling unit 4 and the thermoelectric conversion module 3 to be separated from each other.

Next, the operation and effects of the above-described exhaust heat recovery system 7 according to the fourth embodiment will be explained.

In the exhaust heat recovery system 7 according to the fourth embodiment, the exhaust gas that is discharged from the engine, not shown, flows through the exhaust gas passage 2. Note that, the exhaust gas that flows through the exhaust gas passage 2 passes through the first exhaust gas passageways 22 formed in the heat generation unit 11, then through the catalyst 52 formed in the catalyst storage unit 51, and then through the second exhaust gas passageways 26 formed in the heat recovery unit 12.

In the case that the module cooling unit 4 and the thermoelectric conversion module 3 are in contact (due to supply of coolant to the module cooling unit 4) when the exhaust gas passes through the first exhaust gas passageways 22, the heat contained within the exhaust gas is recovered by the first exhaust heat recovery fins 21 and then discharged from the heat generation unit 11. More specifically, the heat recovered by the first exhaust heat recovery fins 21 is supplied to the thermoelectric conversion module 3 via the casing 20. The exhaust gas discharged from the heat generation unit 11 then flows into the catalyst storage unit 51, and passes through the catalyst 52. At this time, the exhaust gas is purified by the purification action of the catalyst 52, and then discharged from the catalyst storage unit 51.

Next, the exhaust gas discharged from the catalyst storage unit 51 flows into the heat recovery unit 12, and passes through the second exhaust gas passageways 26. At this time, the heat contained in the exhaust gas is further recovered by the second exhaust heat recovery fins 25. In this way, the exhaust gas has more heat removed from it by the second exhaust heat recovery fins 25, and is then discharged from the second exhaust gas passageways 26.

The heat recovered by the second exhaust heat recovery fins 25 in the heat recovery unit 12 is used in the endothermic reaction portion 27 for the endothermic reaction in which the 2-propanol is separated into hydrogen and acetone. The hydrogen and acetone generated by the separation accompanying this endothermic reaction is supplied as a gaseous mixture to the separator 13 via the first gas passage 14, and is then separated by the separator 13 into hydrogen and acetone.

Note that, the temperature sensor 35 is provided for the catalyst storage unit 51, and outputs the temperature detection result for the temperature of the catalyst 52 to the control device 36. The control device 36 stores information related to the temperature at which the catalyst 52 is sufficiently warmed up, and compares this information and the temperature detection result output from the temperature sensor 35. When it is determined that the temperature of the catalyst 52 has reached a sufficiently warm temperature, the control device 36 activates the liquid transferring pump 54 so as to supply coolant to the module cooling unit 4.

When coolant is supplied to the module cooling unit 4, the module cooling unit 4 and the thermoelectric conversion module 3 are placed in contact with each other. As a result of this contact of the module cooling unit 4 and the thermoelectric conversion module 3, a temperature difference is generated between the two opposing side surfaces of the thermoelectric conversion module 3, whereby the thermoelectric conversion module 3 generates electric energy. Accordingly, the heat of the heat generation unit 11 is converted to electric energy.

At this time, the hydrogen and acetone separated by the separator 13 (which are supplied from the endothermic reaction portion 27 of the heat recovery unit 12) flow to the exothermic reaction portion 23 of the heat generation unit 11. 2-propanol is generated by the exothermic reaction of the hydrogen and acetone, and along with this heat is liberated. In this way, the heat recovered by the heat recovery unit 12 is supplied to the thermoelectric conversion module 3 via the heat generation unit 11, which makes it possible to increase the amount of electric energy that is generated by the thermoelectric conversion module 3.

Moreover, when the control device 36 determines that the temperature of the catalyst 52 has not reached the activation temperature based on the temperature detection result output from the temperature sensor 35, the control device 36 stops the liquid transferring pump 54. Accordingly, the supply of coolant to the module cooling unit 4 is interrupted, and the urging force of the spring 53 causes the module cooling unit 4 and the thermoelectric conversion module 3 to be separated from each other.

Once the module cooling unit 4 and the thermoelectric conversion module 3 have been separated from each other, the thermoelectric conversion module 3 is not able to perform thermoelectric conversion. As a result, heat is not recovered from the exhaust gas passing through the heat generation unit 11. Accordingly, exhaust gas containing a large amount of heat flows through the catalyst 52, which enables it to be warmed up more quickly.

Moreover, the hydrogen and acetone separated by the separator 13 (which are supplied from the endothermic reaction portion 27 of the heat recovery unit 12) flow into the exothermic reaction portion 23 of the heat generation unit 11, where heat is generated by the exothermic reaction in which the hydrogen and acetone form 2-propanol. This heat is transmitted to the exhaust gas via the first exhaust heat recovery fins 21, which allows an even greater amount of heat to be imparted to the exhaust gas. Accordingly, it is possible to speed up the catalyst 52 warm-up to an equivalent extent.

Figure 9:
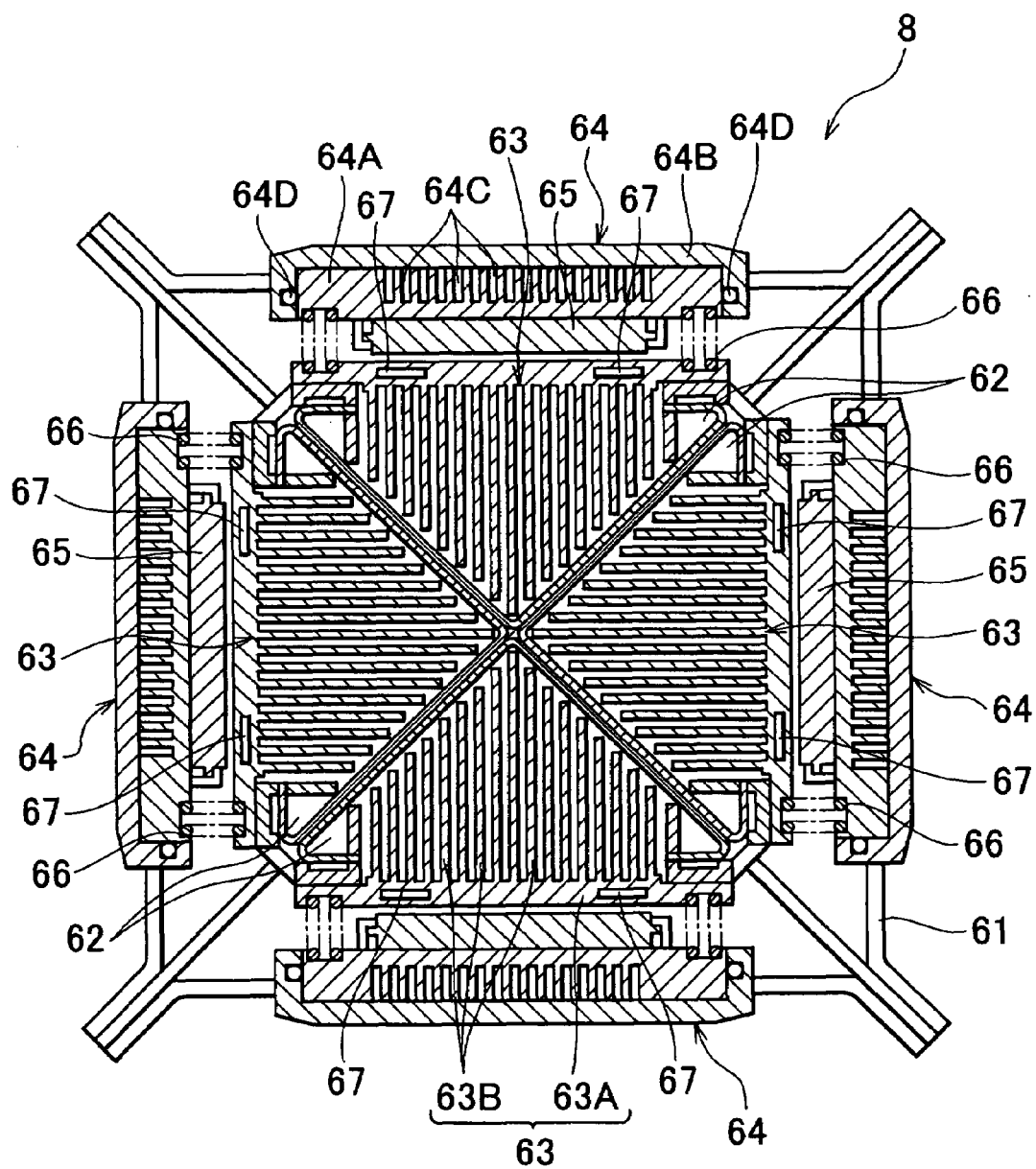
FIG. 9 is a cross-sectional view of an electric generator of a modified form of the fourth embodiment.

Next, a form of the exhaust heat recovery system 7 of the fourth embodiment in which the heat generation unit, the thermoelectric conversion module, and the module cooling unit (hereinafter referred to collectively as an "electric generator") are modified will be described. FIG. 9 is a cross-sectional view of an electric generator 8 of this modified form of the fourth embodiment.

As shown in FIG. 9, the electric generator 8 is provided with a casing 61. Four exhaust gas passages 62 are formed in this casing 61. Exhaust gas discharged from an engine, not shown, flows through the four exhaust gas passages 62 and is discharged toward the catalyst storage unit 51. Fin units 63 for recovering heat contained within the exhaust gas are provided in each of the exhaust gas passages 62. Each fin unit 63 includes a heat transfer portion 63A and fin members 63B. A plurality of the fin members 63B are attached to the heat transfer portion 63A. The heat transfer portion 63A and the plurality of fin members 63B are formed as a single integral unit by extrusion molding or the like.

Further, respective coolant cases 64 are attached to an outer rim section of the casing 61 at positions that correspond to the fin units 63. Each coolant case 64 includes an internal rim 64A and an external rim 64B. The external rim 64B is fixed to the outer rim section of the casing 61, and the inner rim 64A is attached to the external rim 64B so as to be capable of relative movement with respect thereto.

Slit-shaped coolant passages 64C are formed in the internal rim 64A, and coolant supplied by the liquid transferring pump 54 passes therethrough. When coolant passes through these coolant passages 64C, the internal rim 64A is caused to move toward the fin unit 63 side. Moreover, seals 64D are provided at the inner side of the external rim 64B at the position where the internal rim 64A slides. These seals 64D inhibit the coolant that passes through the coolant passages 64C from leaking to the outside.

In addition, a thermoelectric conversion module 65 is attached to an inner side of the internal rim 64A, or, in other words, to the side of the internal rim 64A which is opposite to the external rim 64B and which is on the side of the heat transfer portion 63A of the fin unit 63. When the coolant flows through the coolant passages 64C, and the internal rim 64A is moved to the fin unit 63 side, the thermoelectric conversion module 65 is also moved in the same direction. As a result, the thermoelectric conversion module 65 and the fin unit 63 are placed in contact with each other.

Springs 66 that act as urging means are fitted between an outer side of the heat transfer portion 63A of each fin unit 63 and the internal rim 64A of each coolant case 64. These springs 66 are positioned so as to surround the respective thermoelectric conversion module 65. The springs 66 urge the heat transfer portion 63A of the fin unit 63 and the internal rim 64A of the coolant case 64 in opposite directions, namely, in directions that cause the heat transfer portion 63A and the internal rim 64A to be separated from each other.

Further, exothermic reaction portions 67 are provided in each heat transfer portion 63A of each fin unit 63. The exothermic reaction portions 67 are supplied with hydrogen and acetone from the separator 13. 2-propanol is generated by the exothermic reaction of the hydrogen and acetone that takes place in each exothermic reaction portion 67, and at the same time heat is liberated.

It should be noted that another modified form of the invention can be realized by replacing the heat generation unit 11, the thermoelectric conversion module 3, and the module cooling unit 4 shown in FIG. 7 with the above-described electric generator 8.

Figure 10:
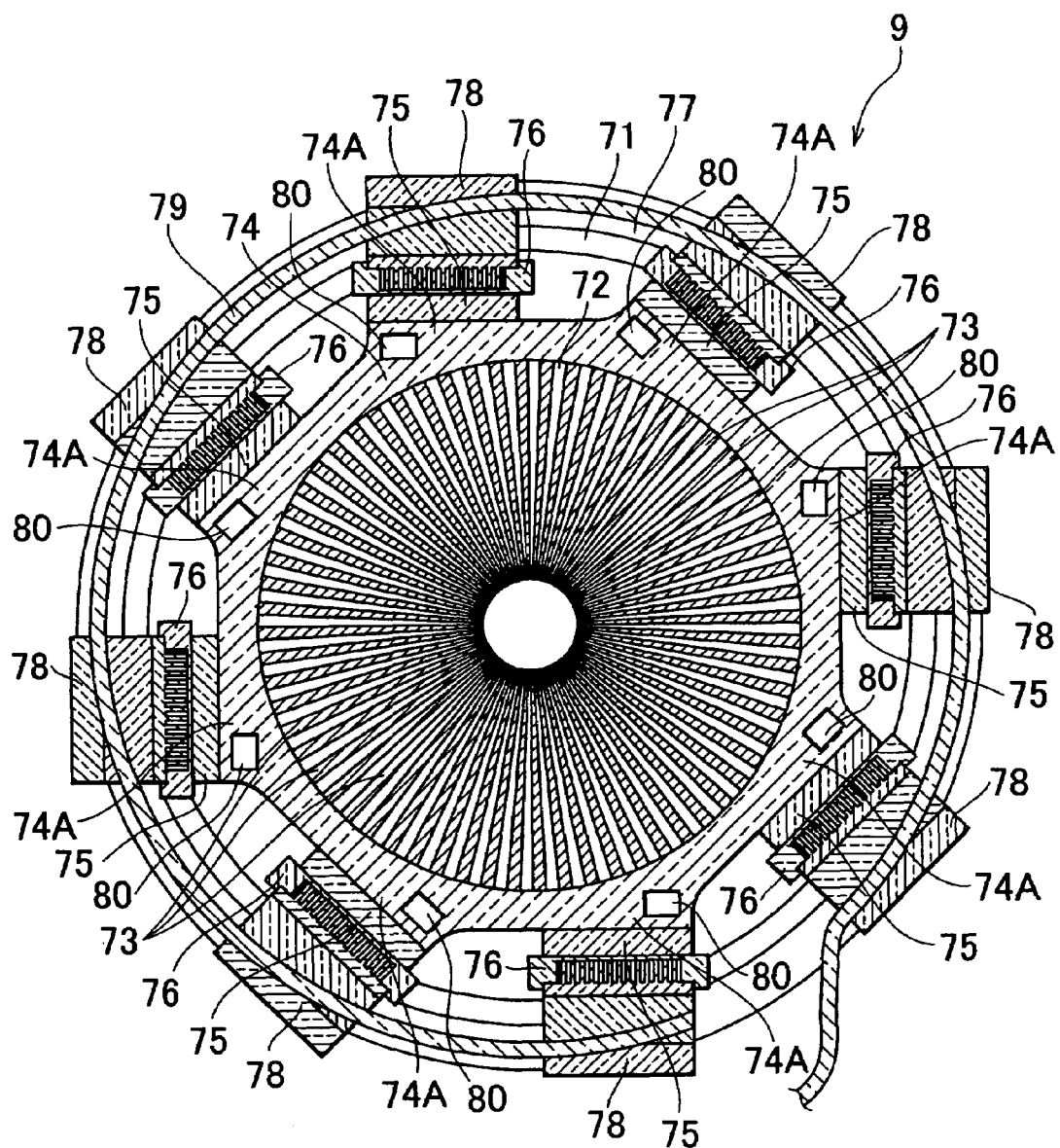
FIG. 10 is a cross-sectional view of an electric generator of a different modified form of the fourth embodiment.

Further, it is possible to use the device shown in FIG. 10 as the electric generator. FIG. 10 is a cross-sectional view of an electric generator 9 of a different modified form of the fourth embodiment.

As shown in FIG. 10, the electric generator 9 according to this form is provided with a casing 71 that has a single exhaust gas passage 72 formed at a central portion thereof. A plurality of fins 73 are provided in this exhaust gas passage 72, and these fins 73 are attached to an inner surface of a tubular heat transfer member 74. The heat transfer member 74 and the fins 73 are formed as a single integral unit by extrusion molding or the like.

Note that, eight heat transfer portions 74A, with an equal distance of separation in the circumferential direction therebetween, are formed at an external periphery portion of the heat transfer member 74. These heat transfer portions 74A correspond to the heat recovery unit of the invention. An external side surface of each heat transfer portion 74A is formed to be a plane, flat surface. These plane, flat surfaces are offset from the center as compared to the external side surface of an imaginary object with an octahedral-cross section with its center at the center of the exhaust gas passage 72.

Respective thermoelectric conversion modules 75 are disposed at positions that correspond to each heat transfer portion 74A. When each thermoelectric conversion module 75 is placed in contact with the respective heat transfer portion 74A of each heat transfer member 74, the heat of the exhaust gas passing through the exhaust gas passage 72 is transferred to the thermoelectric conversion module 75 via the heat transfer member 74.

Respective coolant cases 76 are attached to each thermoelectric conversion module 75. Coolant passages that receive coolant from the liquid transferring pump 54 are formed in the coolant case 76. The coolant cools the thermoelectric conversion module 75.

Moreover, a rotating rail 77 is provided in the casing 71 so as to surround external sides of the coolant cases 76. This rotating rail 77 is disposed so as to be substantially coaxial with the circular cross-section of the exhaust gas passage 72. Moreover, eight rotation guides 78 are formed so as to be capable of sliding movement at the external sides of the coolant cases 76.

Note that, a wire 79 is attached that passes through each rotation guide 78 at a central portion thereof. This wire 79 links all eight of the rotation guides 78. When the wire 79 is pulled, the rotation guides 78 are moved while sliding along the rotation rail 77. One end of the wire 79 is connected to an actuator, not shown, such that the wire 79 can be pulled by driving the actuator.

In addition, the rotating guides 78 are provided with respective springs that act as urging means, not shown. When the wire 79 is not pulled tight, the springs urge the rotating guides 78 in the direction in which the thermoelectric conversion modules 75 and the heat transfer portions 74A come into contact. Accordingly, by driving the actuator, it is possible to pull the wire 79 tight in resistance to the urging force of the spring and move the rotating guides 78. Note that, the actuator receives a control signal output from the control device 36. The control device 36 outputs the control signal to the actuator based on the temperature of the catalyst 52 detected by the temperature sensor 35. With this form of the fourth embodiment, the control device 36 controls and drives the actuator instead of controlling a pump.

Moreover, respective exothermic reaction portions 80 are provided in each heat transfer portion 74A. Hydrogen and acetone from the separator 13 are supplied to each exothermic reaction portion 80. The exothermic reaction of the hydrogen and acetone that takes place in each exothermic reaction portion 80 generates 2-propanol, and at the same time, liberates heat.

It should be noted that another modified form of the invention can be realized by replacing the heat generation unit 11, the thermoelectric conversion module 3, and the module cooling unit 4 shown in FIG. 7 with the above-described electric generator 9.

What is claimed is:

1. An exhaust heat recovery system comprising:
a thermoelectric conversion element that generates electric energy by thermoelectric conversion using heat of exhaust gas discharged from an engine; and
a heat pump including a heat recovery unit that absorbs heat contained in the exhaust gas through an endothermic reaction using a heating medium, and a heat generation unit which generates heat through an exothermic reaction of the heating medium and which supplies the heat to the thermoelectric conversion element, the heat generation unit being disposed in an exhaust passage, wherein
the thermoelectric conversion element and the heat generation unit are attached to each other, and the heat recovery unit is positioned in the exhaust gas passage in an exhaust gas downstream flow direction from the heat generation unit.

2. The exhaust heat recovery system according to claim 1, further comprising:

a cooling unit through which a coolant medium can be passed and which can cool the thermoelectric conversion element; and an urging portion that can switch the thermoelectric conversion element and the cooling unit between an in-contact state and an out-of-contact state.

3. The exhaust heat recovery system according to claim 2, wherein the urging portion places the thermoelectric conversion element and the cooling unit to the in-contact state when the coolant medium is being passed through the cooling unit.

4. An exhaust heat recovery system comprising:

a thermoelectric conversion element that generates electric energy by thermoelectric conversion using heat of exhaust gas discharged from an engine;

a heat pump including a heat recovery unit that absorbs heat contained in the exhaust gas through an endothermic reaction using a heating medium, and a heat generation unit which generates heat through an exothermic reaction of the heating medium and which supplies the heat to the thermoelectric conversion element, the heat generation unit being disposed in an exhaust passage a cooling unit through which a coolant medium can be passed and which can cool the thermoelectric conversion element; and an urging portion that can switch at least one of the thermoelectric conversion element and the heat generation unit, and the thermoelectric conversion element and the cooling unit between respective in-contact states and an out-of-contact states, wherein the heat recovery unit is positioned in the exhaust gas passage in an exhaust gas downstream flow direction from the heat generation unit.

5. The exhaust heat recovery system according to claim 2, wherein the urging portion places both the thermoelectric conversion element and the heat generation unit, and the heat thermoelectric conversion element and the cooling unit in the respective in-contact states when the coolant medium is passing through the cooling unit.

\* \* \* \* \*